US008058727B2

(12) United States Patent
Feng et al.

(10) Patent No.: US 8,058,727 B2
(45) Date of Patent: Nov. 15, 2011

(54) STANDING CHIP SCALE PACKAGE

(75) Inventors: Tao Feng, Santa Clara, CA (US); Anup Bhalla, Santa Clara, CA (US); Yueh-Se Ho, Sunnyvale, CA (US)

(73) Assignee: Alpha and Omega Semiconductor Incorporation, Sunnyvale, CA (US)

( * ) Notice: Subject to any disclaimer, the term of this patent is extended or adjusted under 35 U.S.C. 154(b) by 0 days.

(21) Appl. No.: 12/852,717

(22) Filed: Aug. 9, 2010

(65) Prior Publication Data
US 2010/0320531 A1    Dec. 23, 2010

Related U.S. Application Data

(63) Continuation of application No. 12/217,136, filed on Jun. 30, 2008.

(51) Int. Cl.
*H01L 23/48*    (2006.01)
(52) U.S. Cl. .......... 257/738; 257/737; 257/E23.021; 257/E23.022; 257/E23.023; 257/E23.069
(58) Field of Classification Search .......... 257/737, 257/738, 778, E23.021, E23.069, 288, 329, 257/666, 686, E29.262, E29.255, E23.031, 257/E21.599, E21.705, E23.022, E23.068; 438/612–617; 228/180.22
See application file for complete search history.

(56) References Cited

U.S. PATENT DOCUMENTS

| | | | |
|---|---|---|---|
| 4,426,689 A * | 1/1984 | Henle et al. ............ | 365/52 |
| 6,392,305 B1 | 5/2002 | Huang et al. | |
| 6,646,329 B2 | 11/2003 | Estacio et al. | |
| 6,653,740 B2 | 11/2003 | Kinzer et al. | |
| 6,767,820 B2 | 7/2004 | Standing et al. | |
| 6,841,416 B2 | 1/2005 | Yoon et al. | |
| 7,029,947 B2 * | 4/2006 | Joshi ....................... | 438/110 |
| 7,095,226 B2 | 8/2006 | Wan et al. | |
| 2005/0122100 A1 | 6/2005 | Wan et al. | |

* cited by examiner

*Primary Examiner* — Jasmine Clark
(74) *Attorney, Agent, or Firm* — Jingming Cai; Schein & Cai LLP

(57) ABSTRACT

A standing chip scale package is disclosed. The standing chip scale package provides electrical connection to bumped device contacts on both sides of the chip. The package is coupleable to a printed circuit board in a standing configuration such that front and back sides of the bumped chip are substantially perpendicular to a mounting surface. A process of fabricating the standing chip scale package is also disclosed.

21 Claims, 21 Drawing Sheets

STANDING CHIP SCALE PACKAGE

The instant patent application is a continuation patent application of, and claims priority to, U.S. patent application Ser. No. 12/217,136 filed on Jun. 30, 2008 to Tao Feng et al., which is herein incorporated by reference in its entirety.

BACKGROUND OF THE INVENTION

1. Field of the Invention

The present invention generally relates to a semiconductor package and more particularly to a standing chip scale package.

2. Description of Related Art

The miniaturization of electronic devices has led to the design and manufacture of increasingly smaller semiconductor devices. Semiconductor devices are generally packaged for electrical connection to traces of a printed circuit board. Chip scale packages provide a package on the scale of the semiconductor device to minimize board space consumed by the package.

Vertical conduction power semiconductor devices such as MOSFETs generally have two electrodes or contacts formed on a first surface of the device and a third electrode or contact formed on a second surface of the device. In order to electrically connect the electrodes to the printed circuit board, some conventional chip scale packages provide a means by which all the electrodes are disposed on the same side of the device. For example, U.S. Pat. No. 6,646,329 discloses a package including a leadframe and a die coupled thereto. The die is coupled to the leadframe such that its back surface (drain contact) is coplanar with source leads and a gate lead extending from the leadframe. The disclosed structure is disadvantageously complex.

Another prior art chip scale package includes a die mounted drain side down in a metal clip or can with the source and gate electrodes disposed coplanar with the rim surface of an extended portion of the clip or can as disclosed in U.S. Pat. No. 6,767,820. The disclosed package makes it difficult to visually check solder joints after the package is mounted onto a circuit board.

A flip-chip MOSFET structure disclosed in U.S. Pat. No. 6,653,740 has a vertical conduction semiconductor die in which the lower (drain) layer of the die is connected to a drain electrode on the top of the die by a diffusion sinker or conductive electrode. The disclosed structure suffers the problem of increased resistance and a reduced active area.

It is also known to electrically connect the device electrodes with the printed circuit board by means of conductive blocks or layers. One such structure is disclosed in U.S. Pat. No. 6,392,305 wherein the electrodes of the chip are electrically connected to conductive blocks that in turn are connected to the printed circuit board through side surfaces thereof. U.S. Pat. No. 6,841,416 discloses a chip scale package having upper and lower conductive layers connected to the terminals of the chip. Electrode surfaces formed on the same side surfaces of the upper and lower conductive layers are connected to corresponding connection pads of the printed circuit board. The disclosed structures are overly complex and/or the fabrication process is too complicated and/of inefficient for low cost production.

There remains a need in the art for a chip scale package that provides electrical connection to device contacts on both sides of the chip, a clear view of solder joints, and a reduced printed circuit board mounting area. Preferably the process of fabricating the chip scale package permits batch handling. Further, the chip scale package can preferably be made using simple manufacturing steps and at low cost.

SUMMARY OF THE INVENTION

The standing chip scale package of the invention overcomes the disadvantages of the prior art and achieves the objectives of the invention by providing a chip scale package coupleable to a printed circuit board in a standing configuration such that the planes of the front and back sides of the chip are perpendicular to the plane of the printed circuit board. A bumped chip includes contacts on both sides for electrical connection to the printed circuit board.

In one aspect of the invention, a standing chip scale package includes a chip having contacts formed on front and back sides thereof, each contact including a solder ball electrically coupled thereto to form a bumped chip, and wherein the bumped chip is mountable in a standing configuration such that the front and back sides of the bumped chip are substantially perpendicular to a mounting surface.

In another aspect of the invention, a standing chip scale package includes a chip having contacts formed on a front side thereof, each contact including a solder ball electrically coupled thereto to form a bumped chip, and wherein the bumped chip is mountable in a standing configuration such that the front side and a back side thereof are substantially perpendicular to a mounting surface.

In yet another aspect of the invention, a standing chip scale package includes a first chip and a second chip, the first chip and the second chip being vertical conduction chips the back sides of which are coupled together such that the front sides thereof are disposed in an opposed configuration, the first and second chips further comprising contacts formed on the front sides thereof, each contact so formed including a solder ball electrically coupled thereto to form a bumped common back chip, and wherein the bumped common back chip is mountable in a standing configuration such that the front sides thereof are substantially perpendicular to a mounting surface.

In another aspect of the invention, a process of making a standing chip scale package includes the steps of providing a wafer having a plurality of chips formed thereon, each chip having contacts formed on a front side thereof and a back metal formed on a back side thereof, forming a passivation layer on a wafer back side, opening windows on the wafer back side to expose the back metal of each chip, electroless Ni/Au plating the contacts and the exposed back metal of each chip to form under bump metallization layers, dropping solder balls on the under bump metallization layers, and dicing the wafer to form a plurality of bumped chips.

In yet another aspect of the invention, a process of making a common drain standing chip scale package includes the step of providing first and second wafers having a plurality of dies formed thereon, each die having Al pads formed on a front side thereof and back metal formed on a back side thereof, electroless plating front sides of each wafer while protecting back sides thereof to form under bump metallization layers on the Al pads, determining if the die sizes and positions of the dies formed on the first and second wafers match other, bonding the wafer back sides in case the die sizes and positions match, dicing the second wafer in case the die sizes of the dies formed on the second wafer are smaller than that of the dies sizes of the dies formed on the first wafer and die attaching chips diced from the second wafer to the first wafer, dropping solder balls on the under bump metallization layers, and dicing the first wafer to form a plurality of bumped common drain chips.

In another aspect of the invention, a process of making a surface mount standing chip scale package includes the steps of providing a dummy substrate having a plurality of die areas, etching through holes at the corners of each die area, surface plating the dummy substrate with copper, grooving a top surface of each die area to form a groove and a plurality of contacts, grooving a bottom surface of each die area to form a plurality of contacts, each of the plurality of contacts electrically coupled a corresponding one of the plurality of contacts formed on the top surface, mounting a plurality of bumped chips on the top surface of each die area, molding each of the plurality of bumped chips, and dicing the dummy substrate to form the surface mount standing chip package.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of functional components and to the arrangements of these components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF A PREFERRED EMBODIMENT OF THE INVENTION

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

The present invention provides a standing chip scale package that provides electrical connection to bumped device contacts on both sides of the chip. The package is coupleable to a printed circuit board in a standing configuration such that the front and back sides of the bumped chip are substantially perpendicular to a mounting surface.

Figure 1A:
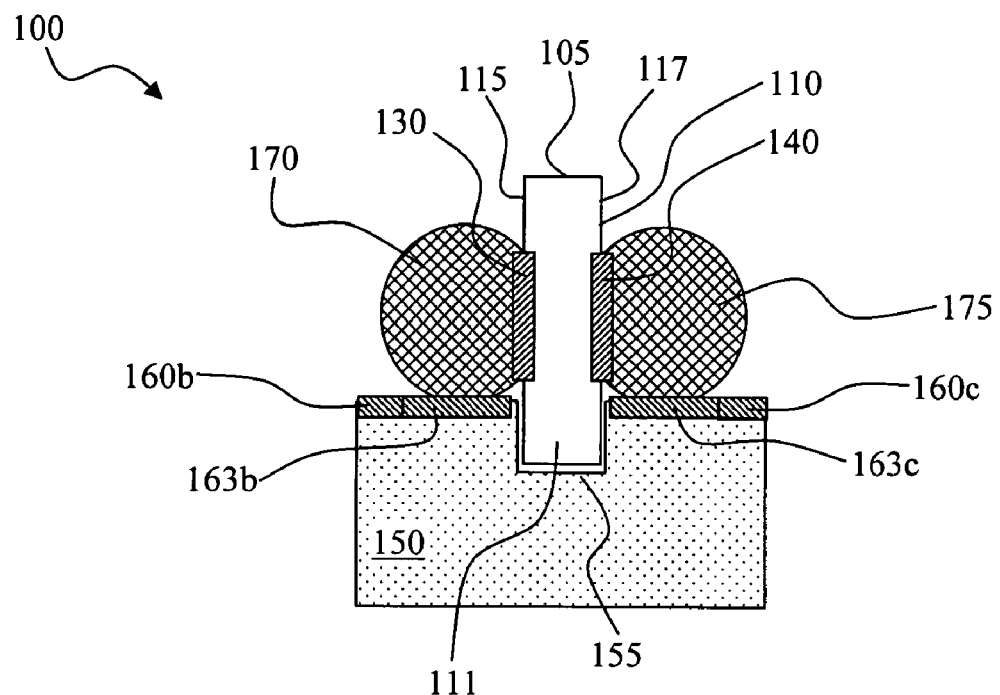
FIG. 1A is a cross-sectional schematic representation of a standing chip scale package taken along line A-A of FIG. 1E, showing the package coupled to a grooved printed circuit board in accordance with a first embodiment of the invention.
Figure 1B:
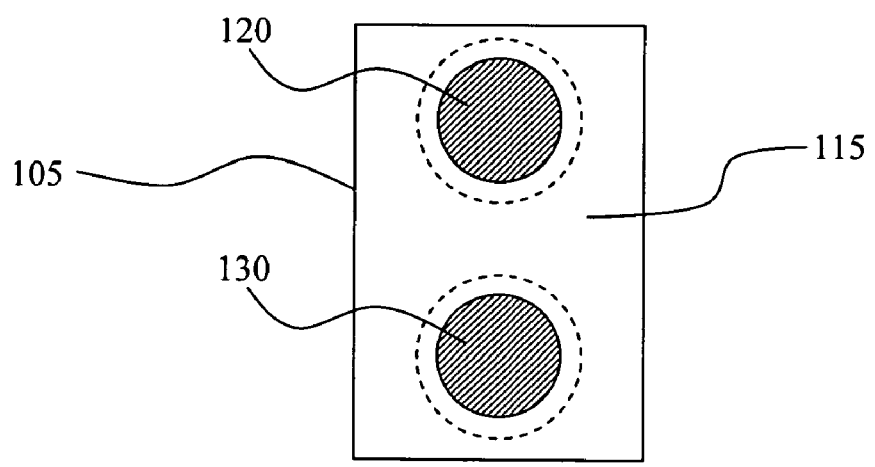
FIG. 1B is a top plan schematic representation of a front surface of a die in accordance with the first embodiment of the invention.

A first embodiment of a standing chip scale package generally designated 100 is shown in FIG. 1A electrically coupled to a grooved printed circuit board (PCB) 150. FIG. 1E shows a top plan view of the standing chip scale package 100 mounted on the grooved PCB 150 and FIG. 1A shows a cross-sectional view taken along the line A-A of FIG. 1E. The standing chip scale package 100 comprises a chip 105 including a power vertical conduction semiconductor device such as a power MOSFET.

Figure 1C:
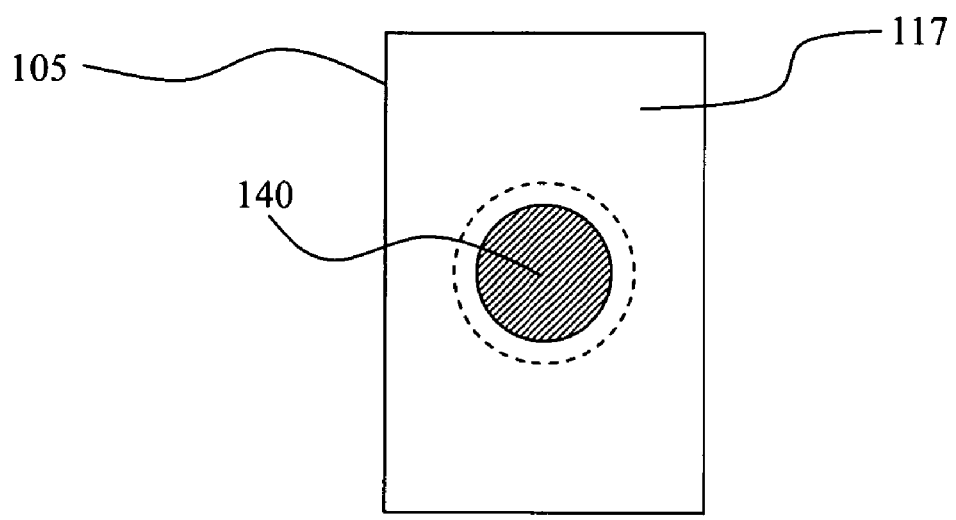
FIG. 1C is a top plan schematic representation of a back surface of the die in accordance with the first embodiment of the invention.

The chip 105 has a front surface 115 (FIG. 1B) and a back surface 117 (FIG. 1C). Disposed on the front surface 115 are a gate contact 120 and a source contact 130. A drain contact 140 is disposed on the back surface 117.

Figure 9:
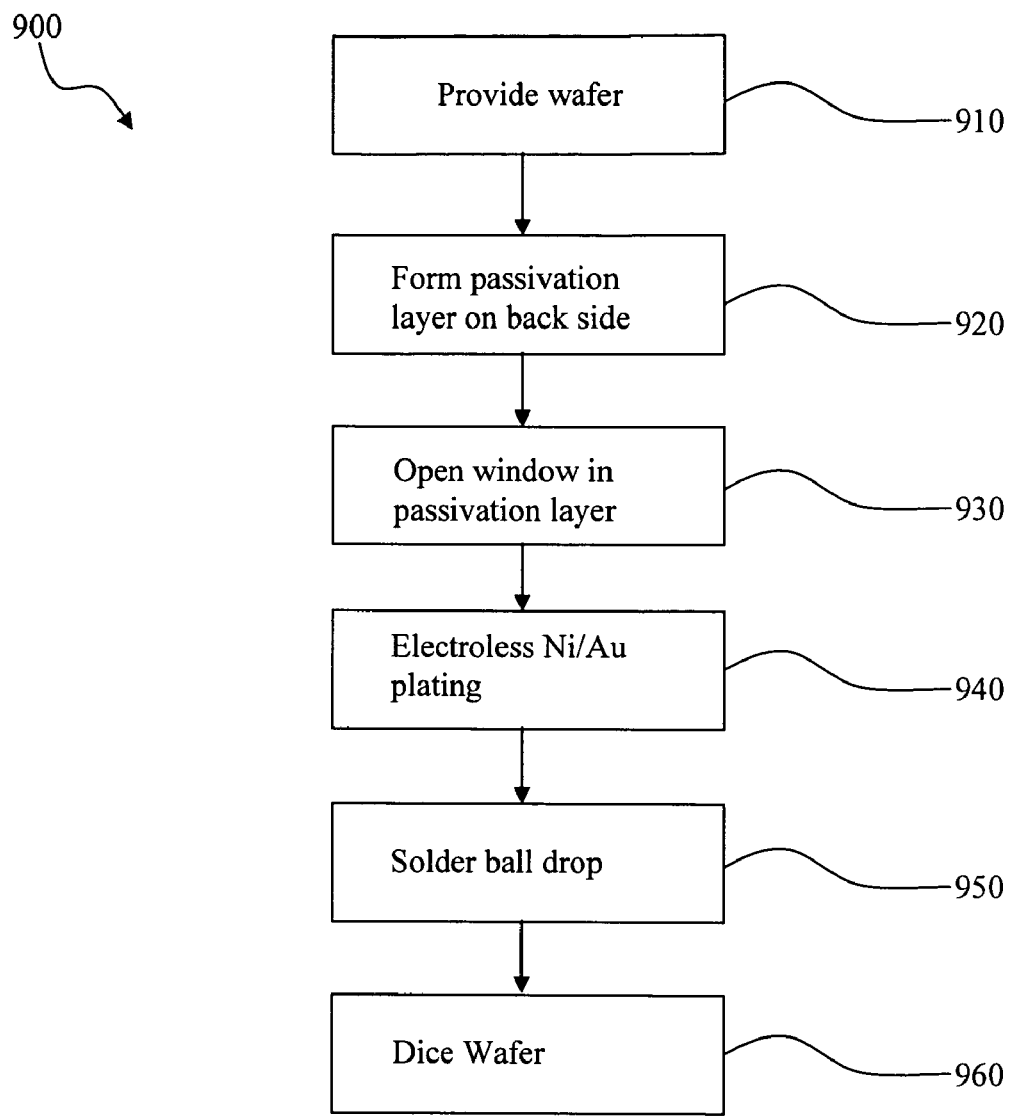
FIG. 9 is a flow chart showing a standing chip scale package fabrication process in accordance with the invention.

The gate contact 120, the source contact 130, and the drain contact 140 are formed on the chip 100 by a fabrication process 900 shown in FIG. 9 that includes a step 910 in which a wafer is provided having Al pads formed on the front side of the wafer and a Ti/Al alloy back metal. In a step 920 a passivation layer is formed on the wafer back side and in a step 930 at least one window is opened in the passivation layer to expose the back metal. In the first embodiment, a single window is opened. Electroless Ni/Au plating is performed on both sides of the wafer in a step 940 to provide for under bump metallization (UBM) to prepare the metalized contacts for the solder balls. In the figures, the gate, source and drain contacts include the UBM, unless stated otherwise. Also, the passivation layers are not shown for simplicity.

The standing chip scale package 100 has bumped contacts for electrical connection to the printed circuit board 150. Solder balls are dropped onto the metalized contacts in a step 950 and in a step 960 the bumped wafer is diced to provide a plurality of bumped chips 110. Dicing may be accomplished using a special saw. Bumped gate and source contacts 120 and 130 are provided on the front surface 115 of the bumped chip 110 and include gate and source solder balls 165 and 170 (FIG. 1E). A bumped drain contact 140 is provided on the back surface 117 of the bumped chip 110 and includes a drain solder ball 175. The outlines of the solder balls over the metal contacts are indicated by the dashed lines in FIG. 1B and 1C.

Figure 1D:
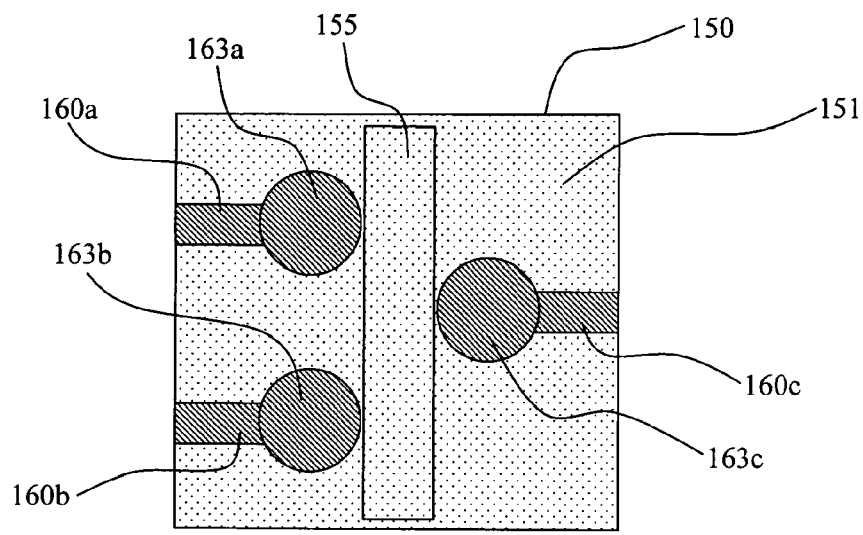
FIG. 1D is a top plan schematic representation of the grooved printed circuit board in accordance with the first embodiment of the invention.
Figure 1E:
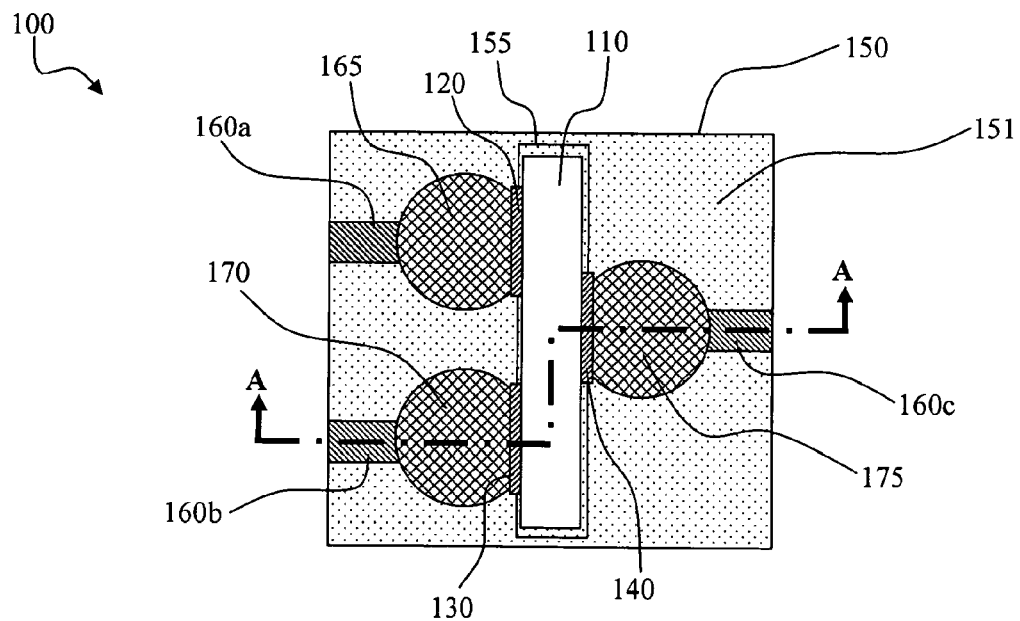
FIG. 1E is a top plan schematic representation of the standing chip scale package coupled to a grooved printed circuit board in accordance with the first embodiment of the invention.

With reference to FIG. 1D, there is shown a top plan view of the printed circuit board 150. Traces 160a, 160b and 160c are formed on the surface 151 thereof and include rounded ends 163a, 163b, and 163c respectively. Traces 160a and 160b provide electrical connection to the gate contact 120 and the source contact 130 respectively, while trace 160c provides electrical connection to the drain contact 140. Rounded ends 163a, 163b, and 163c are sized and oriented to underlay the solder balls 165, 170, and 175, respectively when the bumped chip 110 is positioned within a groove or indentation 155 formed along a portion of the printed circuit board 150.

The groove 155 is sized and configured to closely receive a side portion 111 of the bumped chip 110. The groove 155 provides alignment to the bumped chip 110 such that solder balls 165, 170, and 175 are in overlaying relationship to rounded ends 163a, 163b, and 163c as shown in FIGS. 1A and 1E. Additionally, the groove 155 maintains the bumped chip 110 in a standing position wherein the side portion 111 of the bumped chip 110 is disposed within the groove 155 during solder reflow. Advantageously, the printed circuit board 150, being non-conductive, reduces the possibility of a short circuit between the drain contact 140 and the gate and source contacts 120 and 130 of the bumped chip 110. Furthermore, in the case where the bumped chips 110 are diced using laser dicing, silicon dioxide may form on the side surfaces of the bumped chips to provide further short circuit protection.

Figure 2A:
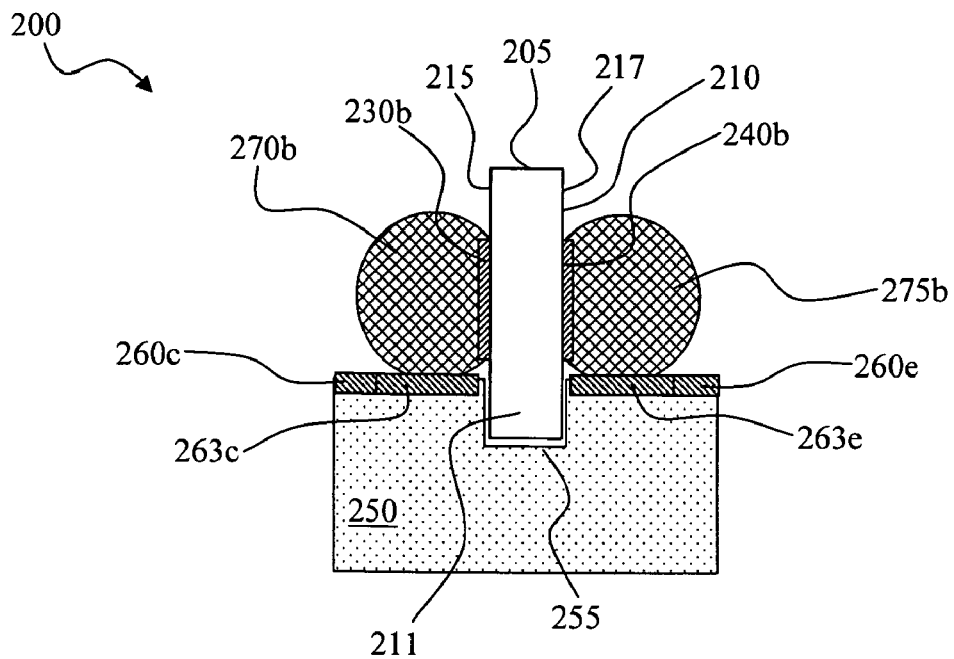
FIG. 2A is a cross-sectional schematic representation of a standing chip scale package taken along the line A-A of FIG. 2E, showing the package coupled to a grooved printed circuit board in accordance with a second embodiment of the invention.
Figure 2B:
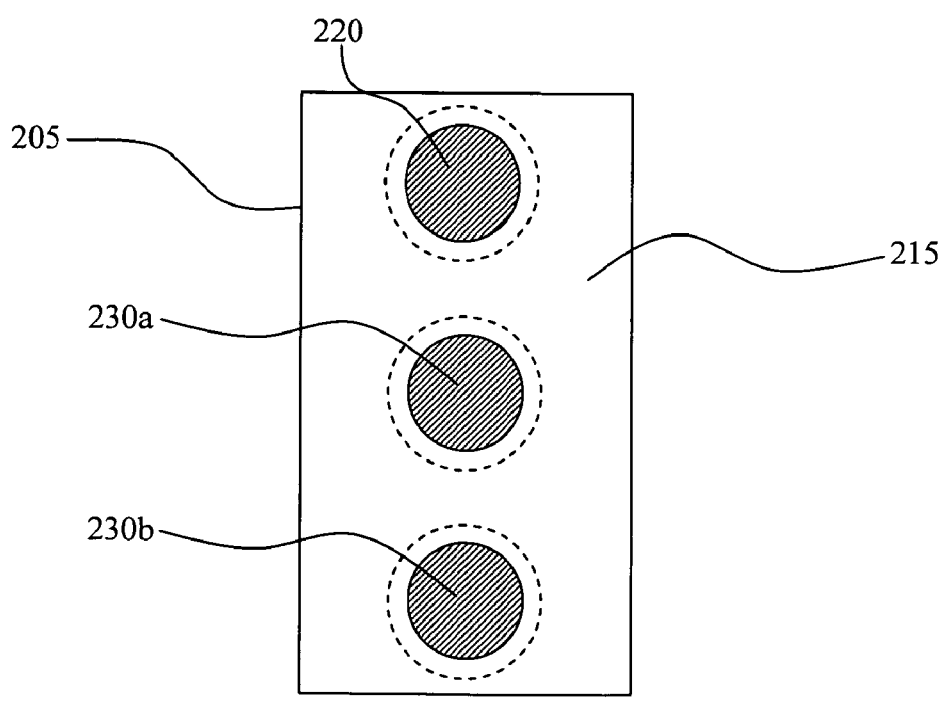
FIG. 2B is a top plan schematic representation of a front surface of a die in accordance with the second embodiment of the invention.
Figure 2C:
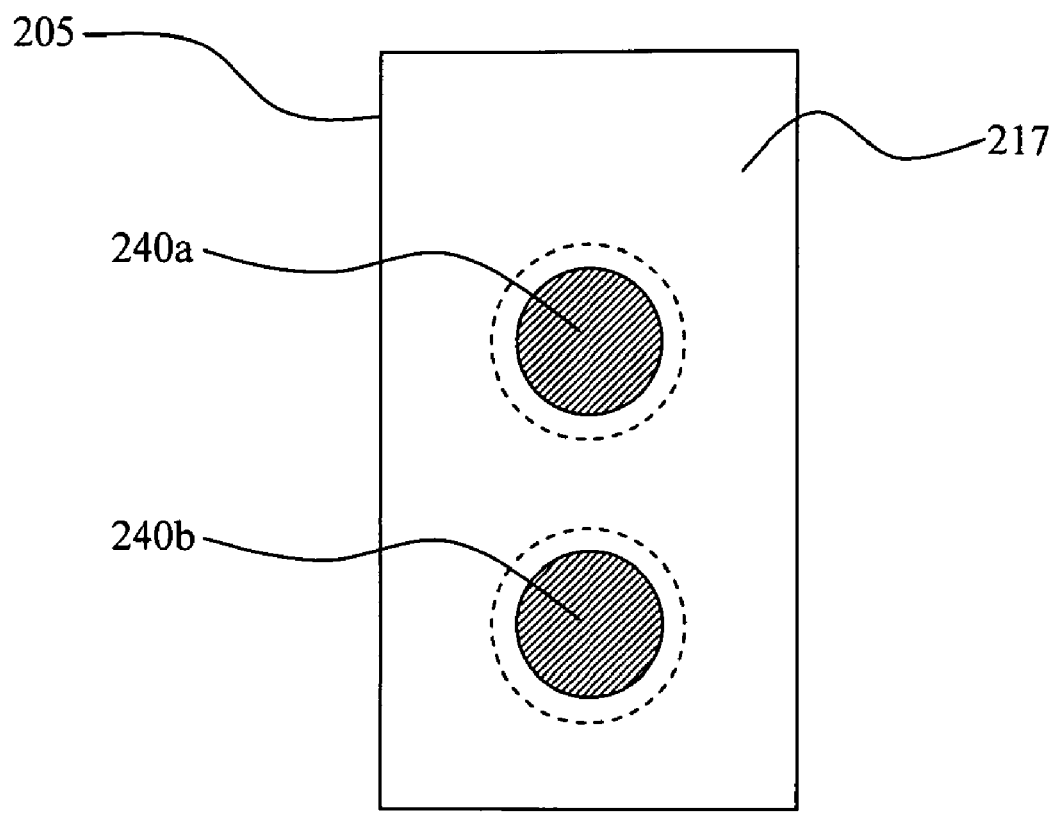
FIG. 2C is a top plan schematic representation of a back surface of the die in accordance with the second embodiment of the invention.
Figure 2D:
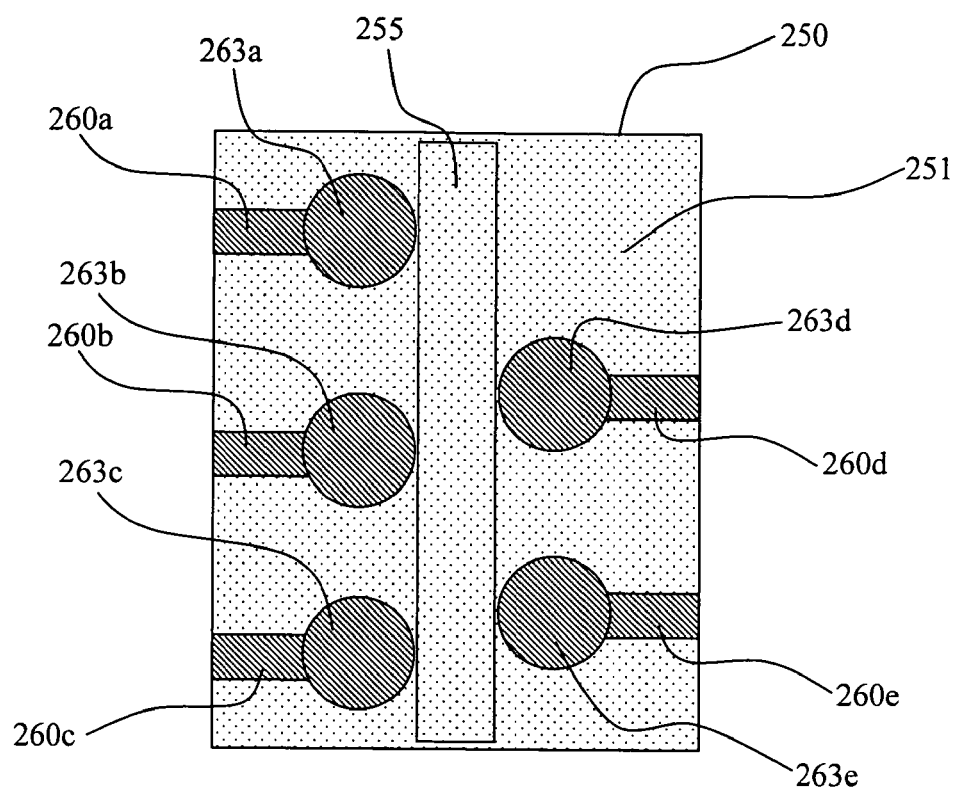
FIG. 2D is a top plan schematic representation of the grooved printed circuit board in accordance with the second embodiment of the invention.
Figure 2E:
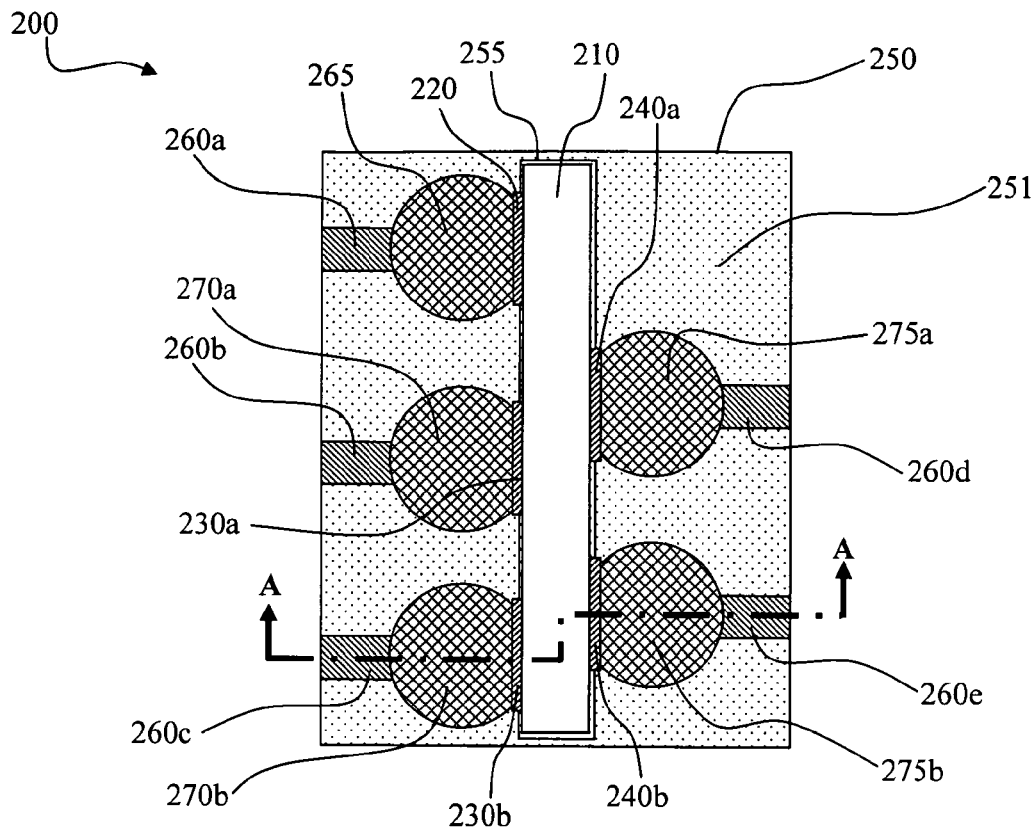
FIG. 2E is a top plan schematic representation of the standing chip scale package coupled to the grooved printed circuit board in accordance with the second embodiment of the invention.

With reference to FIGS. 2A-2E, there is shown a second embodiment of a standing chip scale package generally designated 200 electrically coupled to a grooved printed circuit board 250. FIG. 2E shows a top plan view of the standing chip scale package 200 mounted on the grooved printed circuit board 250, and FIG. 2A shows a cross-sectional view taken along the line A-A of FIG. 2E. The standing chip scale package 200 comprises a chip 205 including a power vertical conduction semiconductor device such as a power MOSFET. The second embodiment is similar to the first embodiment shown in FIGS. 1A-1E except that the source and drain have multiple metal contacts instead of just one each.

The chip 205 has a front surface 215 (FIG. 2B) and a back surface 217 (FIG. 2C). Disposed on the front surface 215 are a gate contact 220 and source contacts 230a and 230b. Drain contacts 240a and 240b are disposed on the back surface 217. The outlines of the solder balls dropped on these contacts are indicated by dashed lines in FIGS. 2B and 2C.

The gate contact 220, the source contacts 230a and 230b, and the drain contacts 240a and 240b are formed on the chip 205 by the fabrication process 900 described with reference to FIG. 9. In this embodiment, two windows are opened for both the source and the drain in step 930. Bumped gate and source contacts 220, and 230a and 230b are provided on the front surface 215 of the chip 205 by solder balls 265, 270a, and 270b respectively, and bumped drain contacts 240a and 240b are provided on the back surface 217 of the chip 205 by solder bumps 275a and 275b to provide a bumped chip 210 (FIG. 2E).

With reference to FIG. 2D, there is shown a top plan view of the printed circuit board 250. Traces 260a, 260b, 260c, 260d, and 260e are formed on the surface 251 thereof and include rounded ends 263a, 263b, 263c, 263d, and 263e respectively. Trace 260a provides electrical connection to the gate contact 220. Traces 260b and 260c provide electrical connection to source contacts 230a and 230b. Traces 260d and 260e provide electrical connection to drain contacts 240a and 240b. Rounded ends 263a, 263b, 263c, 263d, and 263e are sized and oriented to underlay the solder balls when the bumped chip 210 is positioned within a groove or indentation 255 formed along a portion of the printed circuit board 250.

The groove 255 is sized and configured to closely receive a side portion 211 of the bumped chip 210. The groove 255 provides alignment to the bumped chip 210 such that solder balls 265, 270a, 270b, 275a, and 275b are in overlaying relationship to rounded ends 263a, 263b, 263c, 263d and 263e, respectively, as shown in FIGS. 1A and 1E. Additionally, the groove 255 maintains the bumped chip 210 in a standing position wherein the side portion 211 of the bumped chip 210 is disposed within the groove 255 during solder reflow. Advantageously, the printed circuit board 250, being non-conductive, reduces the possibility of a short circuit between the drain contacts 240a and 240b and the gate and source contacts 220, and 230a and 230b of the bumped chip 210.

A third embodiment of a standing chip scale package, generally designated 300, is shown in FIGS. 3A-3E electrically coupled to a printed circuit board 350. The standing chip scale package 300 comprises a chip 305 including a power vertical conduction semiconductor device such as a power MOSFET.

The standing chip scale package 300 is in all respects identical to the standing chip scale package 100 described above with the exception that the package 300 is designed for electrical connection to a printed circuit board 350 that does not include a groove. As a consequence, the contacts of the chip 305 are positioned nearer the edge of the chip 305 as compared to the contacts of the chip 105. Thus, and with reference to FIGS. 3B and 3C, a gate contact 320 and a source contact 330 are formed nearer to an edge 307 of the chip 305 on a front surface 315 of the chip 305. In similar fashion, a drain contact 340 is formed nearer to the edge 307 on a back surface 317.

Figure 3A:
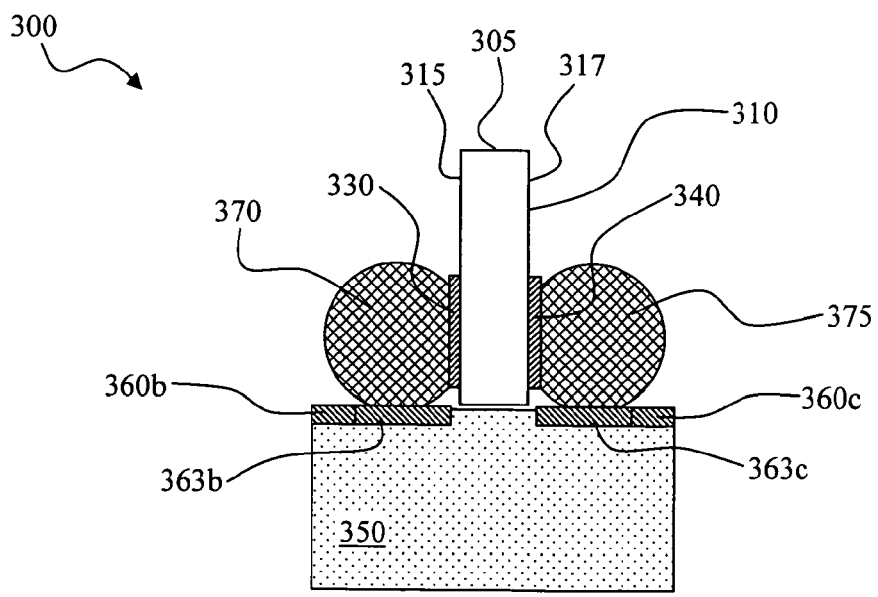
FIG. 3A is a cross-sectional schematic representation of a standing chip scale package taken along the line A-A of FIG. 3E, showing the package coupled to a non-grooved printed circuit board in accordance with a third embodiment of the invention.
Figure 3B:
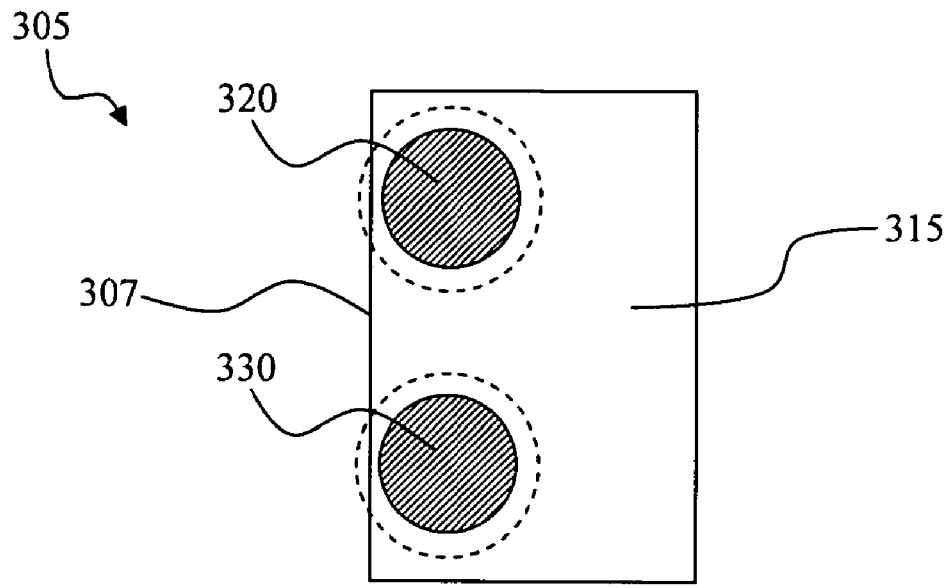
FIG. 3B is a top plan schematic representation of a front surface of a die in accordance with the third embodiment of the invention.
Figure 3C:
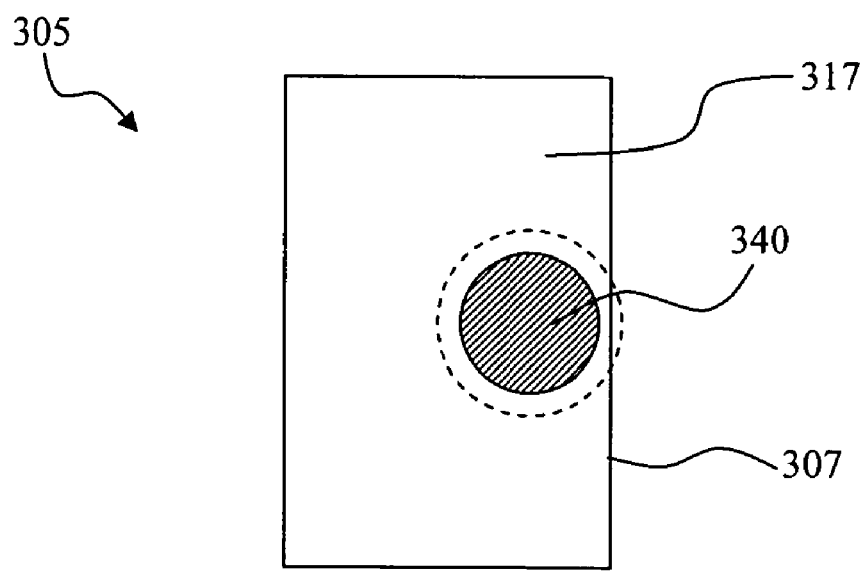
FIG. 3C is a top plan schematic representation of a back surface of the die in accordance with the third embodiment of the invention.
Figure 3D:
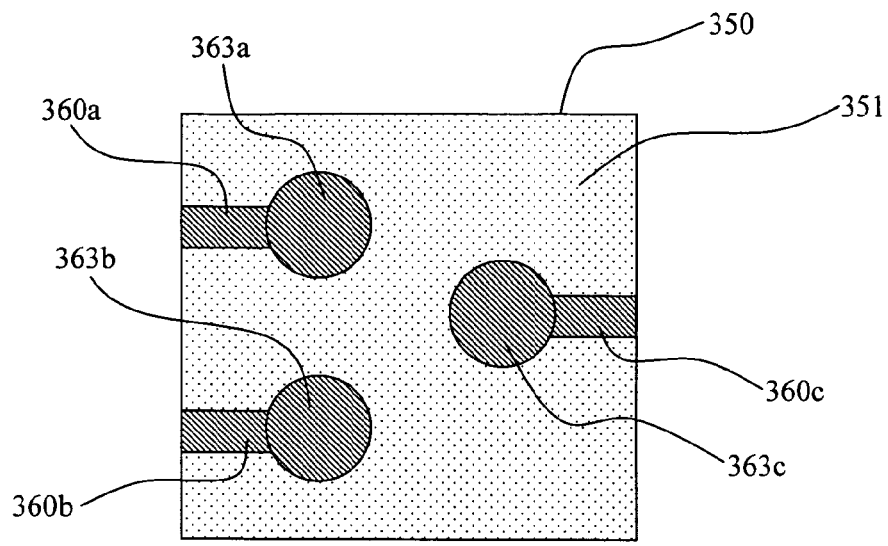
FIG. 3D is a top plan schematic representation of the printed circuit board in accordance with the third embodiment of the invention.

The printed circuit board 350 is shown in FIG. 3D having traces 360a, 360b, and 360c identical to traces 160a, 160b, and 160c (FIG. 1D). No groove is provided and a bumped chip 310 is electrically coupled to traces 360a, 360b, and 360c at the rounded ends 363a, 363b, and 363c by solder reflow.

Figure 3E:
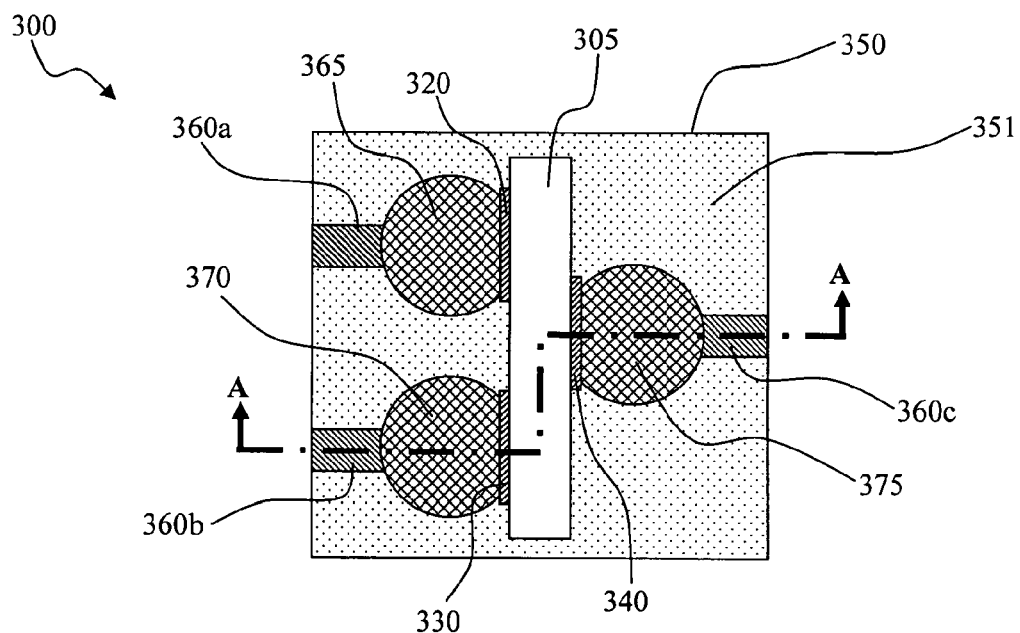
FIG. 3E is a top plan schematic representation of the standing chip scale package coupled to the non-grooved printed circuit board in accordance with the third embodiment of the invention.

With reference to FIGS. 3A and 3E, the package 300 is shown electrically coupled to the printed circuit board 350. Solder balls 365, 370 and 375 are coupled to under metal contact layers 320, 330, and 340 respectively. Solder reflow of solder balls 365, 370 and 375 couples the gate contact 320 to trace 360a, the source contact 330 to trace 360b, and the drain contact 340 to the trace 360c respectively.

A fourth embodiment of a standing chip scale package, generally designated 400, is shown in FIGS. 4A-4D electrically coupled to a printed circuit board 450. The standing chip scale package 400 comprises a chip 405 including a power vertical conduction semiconductor device such as a power MOSFET.

Figure 4A:
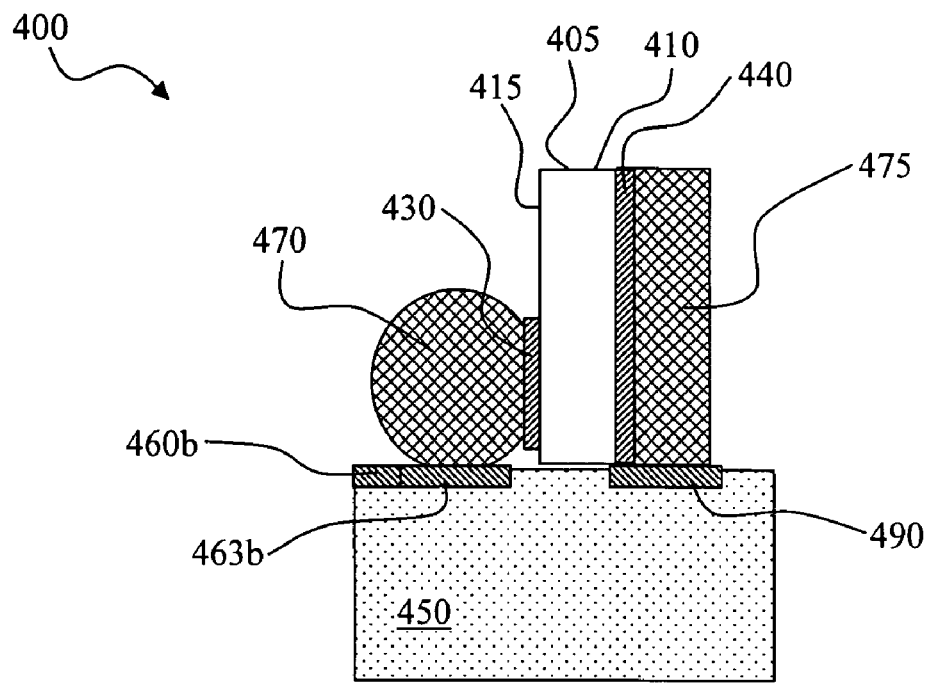
FIG. 4A is a cross-sectional schematic representation of a standing chip scale package taken along line A-A of FIG. 4E, showing the package coupled to a printed circuit board in accordance with a fourth embodiment of the invention.
Figure 4B:
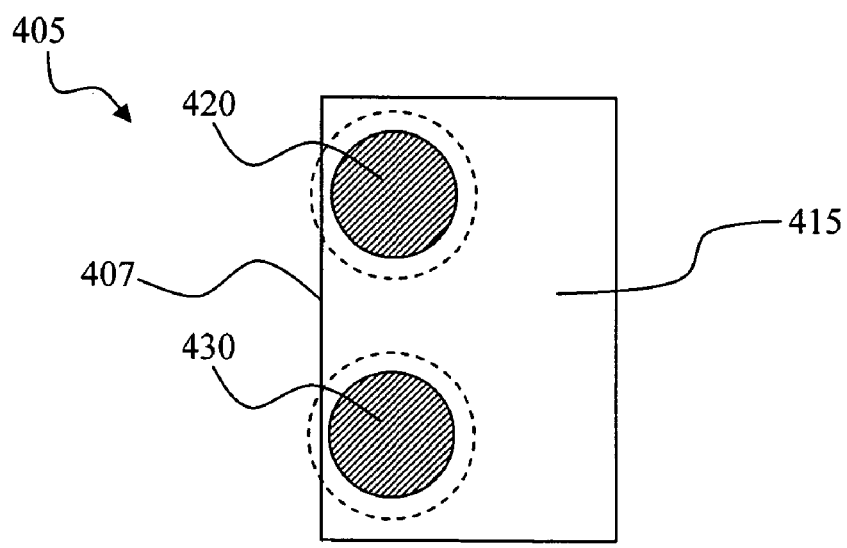
FIG. 4B is a top plan schematic representation of a front surface of a die in accordance with the fourth embodiment of the invention.
Figure 4C:
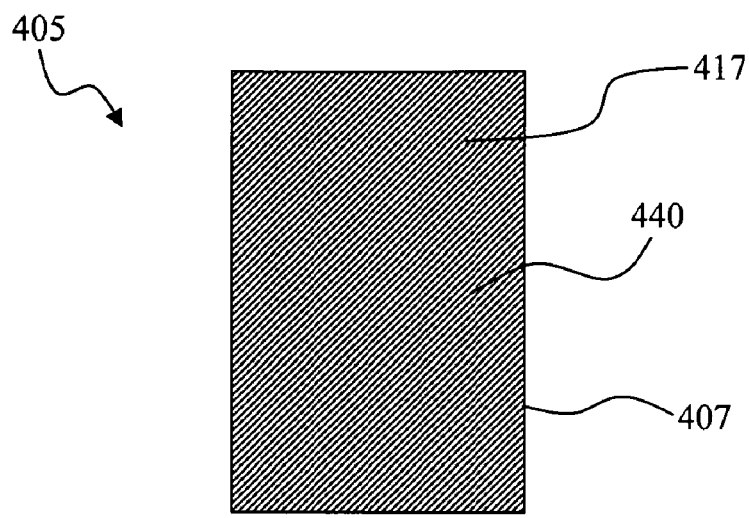
FIG. 4C is a top plan schematic representation of a back surface of the die in accordance with the fourth embodiment of the invention.

The chip 405 has a front surface 415 (FIG. 4B) and a back surface 417 (FIG. 4C). Disposed on the front surface 415 are a gate contact 420 and a source contact 430 formed near an edge 407 of the chip 405. A drain contact 440 is disposed on the back surface 417 and includes a thick layer of solder.

The gate contact 420 and the source contact 430 are formed on the chip 405 by the fabrication process 900 described with reference to FIG. 9. A thick solder layer 475 is deposited on the drain contact 440 on the back surface 417 of the chip 405. A passivation layer is not necessary on the back surface 417.

Figure 4D:
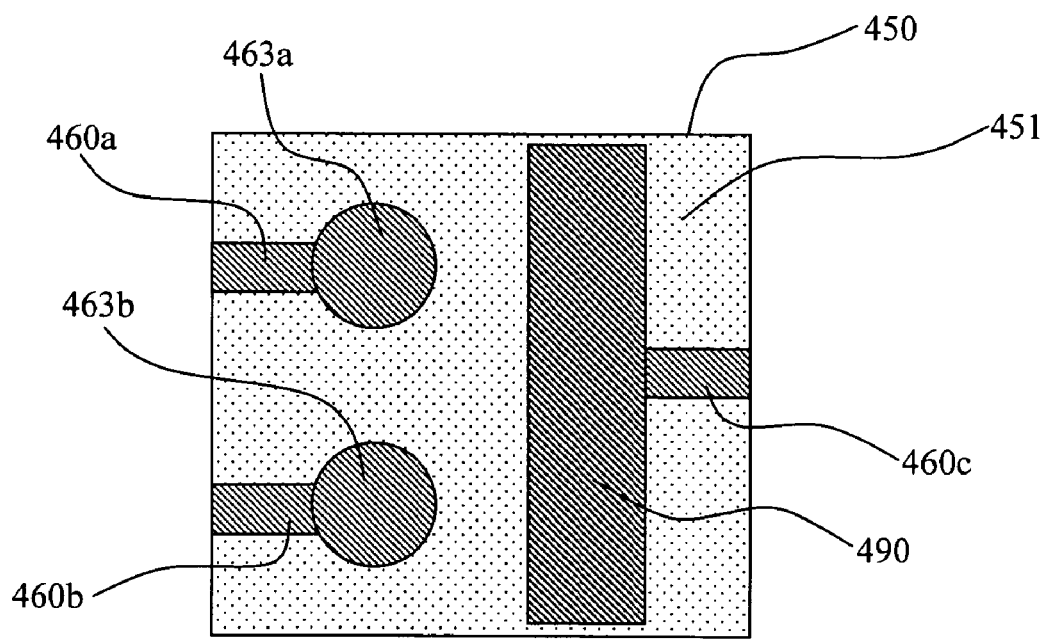
FIG. 4D is a top plan schematic representation of the printed circuit board in accordance with the fourth embodiment of the invention.
Figure 4E:
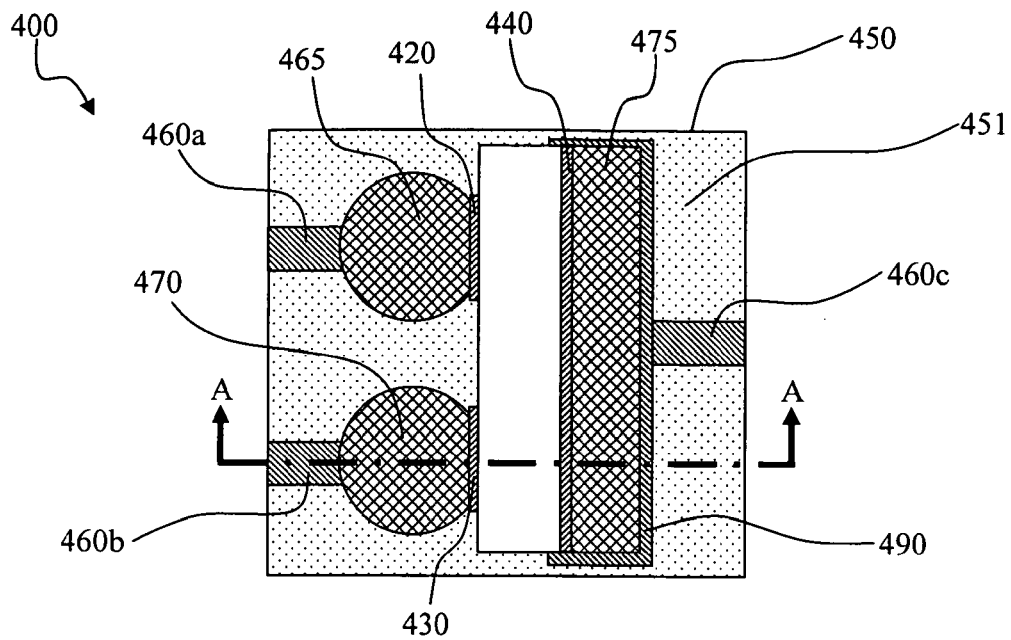
FIG. 4E is a top plan schematic representation of the standing chip scale package coupled to the printed circuit board in accordance with the fourth embodiment of the invention.

With reference to FIG. 4D, there is shown a top plan view of the printed circuit board 450. Traces 460a and 460b are formed on the surface 451 thereof and include rounded ends 463a and 463b respectively. Trace 460a provides electrical connection to the gate contact 420. Trace 460b provides electrical connection to the source contact 430. Conductive post 490 of trace 460c provides electrical connection to the drain contact 440. Rounded ends 463a and 463b are sized and oriented to underlay the solder balls 465 and 470 respectively when the bumped chip 410 is positioned on the printed circuit board 450 with the solder layer 475 of the back surface 417 of the bumped chip 410 abutting the conductive post 490.

With reference to FIGS. 5A-5D, there is shown a fifth embodiment of a standing chip scale package generally designated 500 electrically coupled to a grooved printed circuit board 550. The standing chip scale package 500 comprises two chips 510 and 520 including power vertical conduction semiconductor devices such as a power MOSFETs. Chip 510 is larger than or the same size as chip 520 and chips 510 and 520 are coupled in a common drain configuration.

The chip 510 has a front surface 511 (FIG. 5B) and a back surface (not shown). Disposed on the front surface 511 are a gate contact 530 and a source contact 535. A drain contact (not shown) includes a Ti/Ni/Ag back metal. The chip 520 has a front surface 521 and a back surface (not shown). Disposed on the front surface 521 are a gate contact 540 and a source contact 545. A drain contact (not shown) includes a Ti/Ni/Ag back metal.

Figure 10:
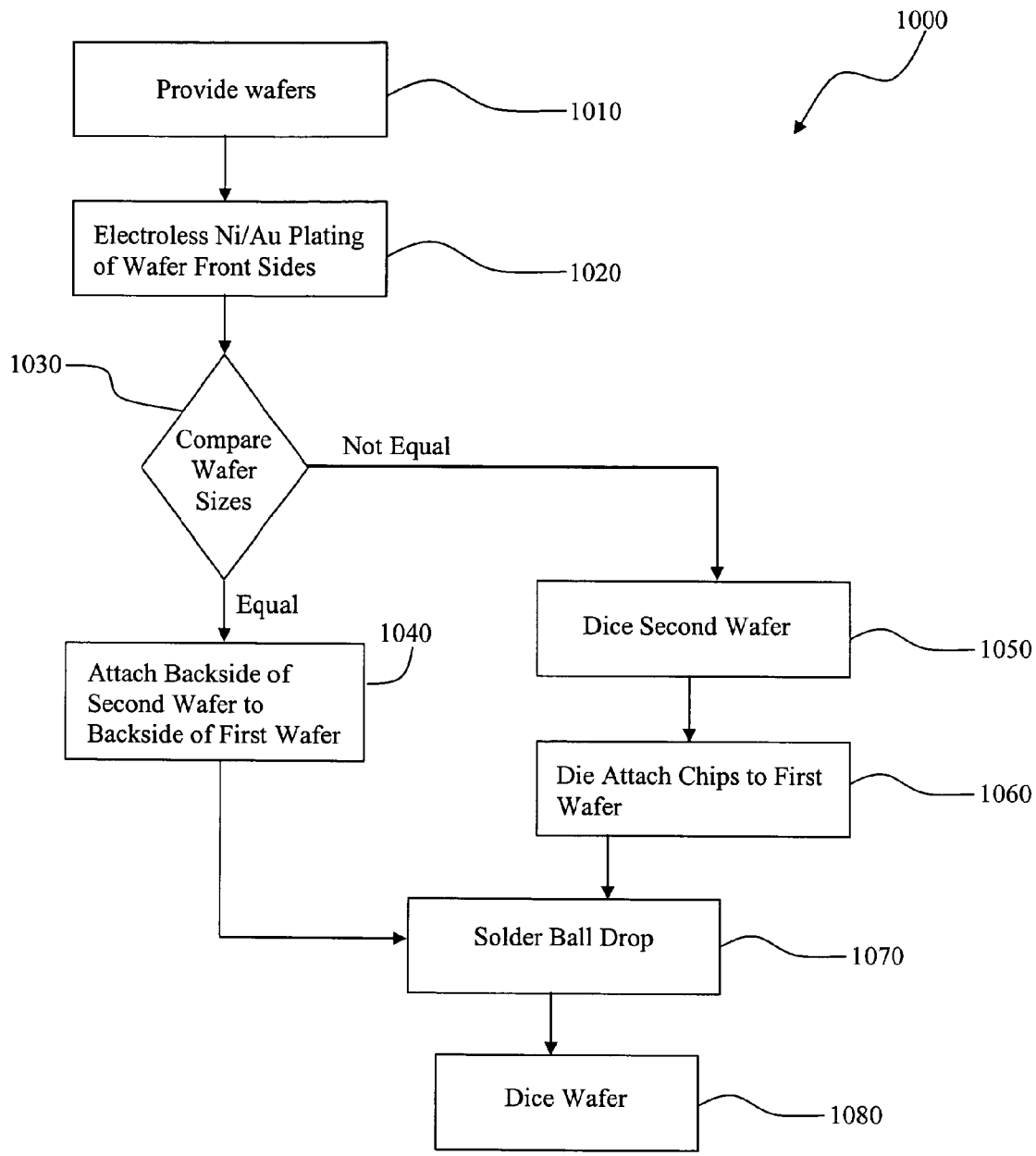
FIG. 10 is a flow chart showing a common drain standing chip scale package fabrication process in accordance with the invention.

The drain contacts of the chips 510 and 520 may be electrically connected in accordance with a process 1000 as shown in FIG. 10. In a step 1010 two wafers are provided. A first wafer includes a plurality of chips 510 and a second wafer includes a plurality of chips 520. The backsides of the wafers include the back surfaces of the chips 510 and 520 and comprise a Ti/Ni/Ag back metal. In a step 1020, the front sides of both wafers are plated by electroless Ni/Au plating with the back sides thereof protected. In a step 1030, a determination is made whether the size of the chips 510 is equal to the size of the chips 520. If the sizes are equal and the layouts of the two wafers match each other, then in a step 1040 the back sides of the two wafers are bonded together in such manner that the two wafers are positioned with the chips 510 aligned with the chips 520. If chips 510 are larger than the chips 520, in a step 1050 the second wafer is diced into chips 520 and in a step 1060 the chips 520 are die attached to the chips 510 of the first wafer in a common drain configuration. For this purpose, alignment is facilitated by an infrared camera or laser marking of the first wafer back side. In both steps 1040 and 1060, conductive epoxy 551 may be used. Alternatively, solder with a higher reflow temperature than that of solder balls 565, 570, 575, and 580 may be used.

Figure 5A:
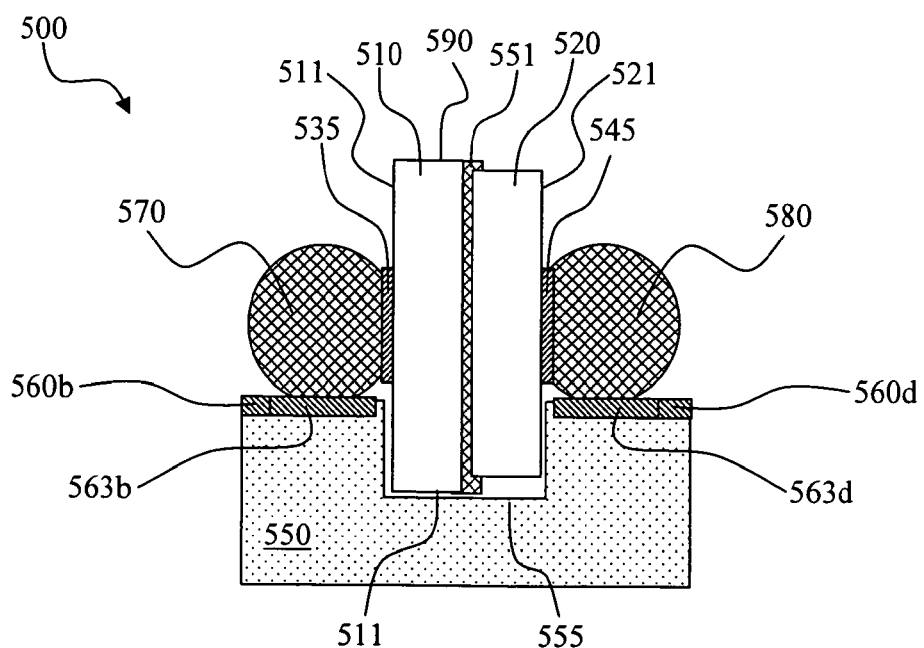
FIG. 5A is a cross-sectional schematic representation of a dual die common drain standing chip scale package taken along the line A-A of FIG. 5E, showing the package coupled to a printed circuit board in accordance with a fifth embodiment of the invention.
Figure 5B:
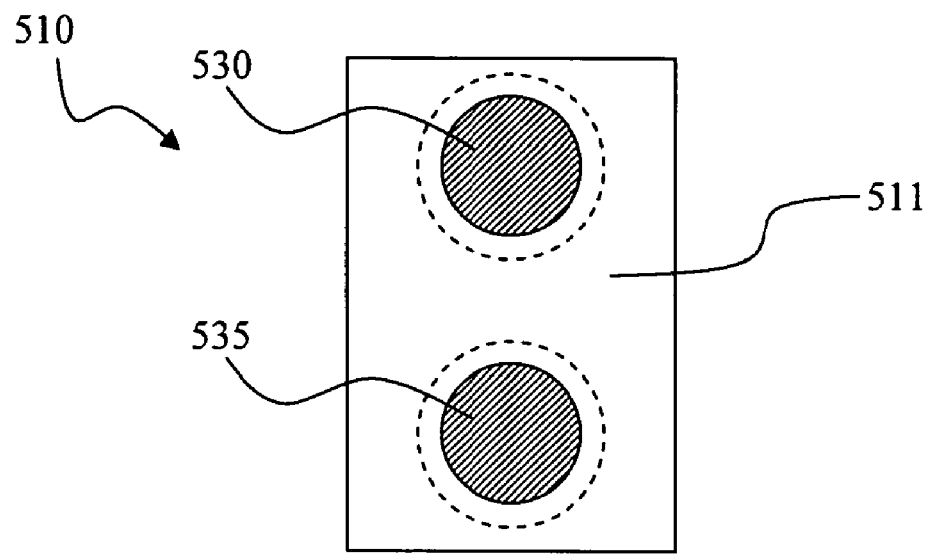
FIG. 5B is a top plan schematic representation of a front surface of a first die in accordance with the fifth embodiment of the invention.
Figure 5C:
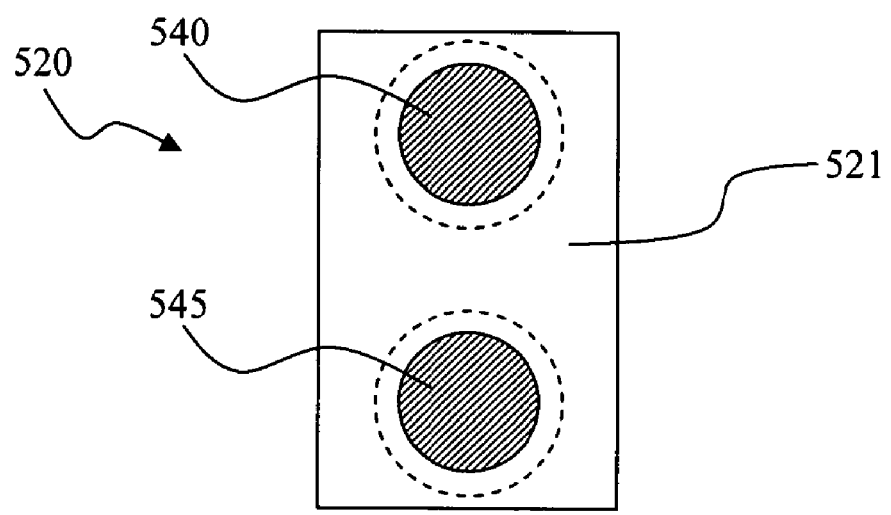
FIG. 5C is a top plan schematic representation of a front surface of a second die in accordance with the fifth embodiment of the invention.
Figure 5D:
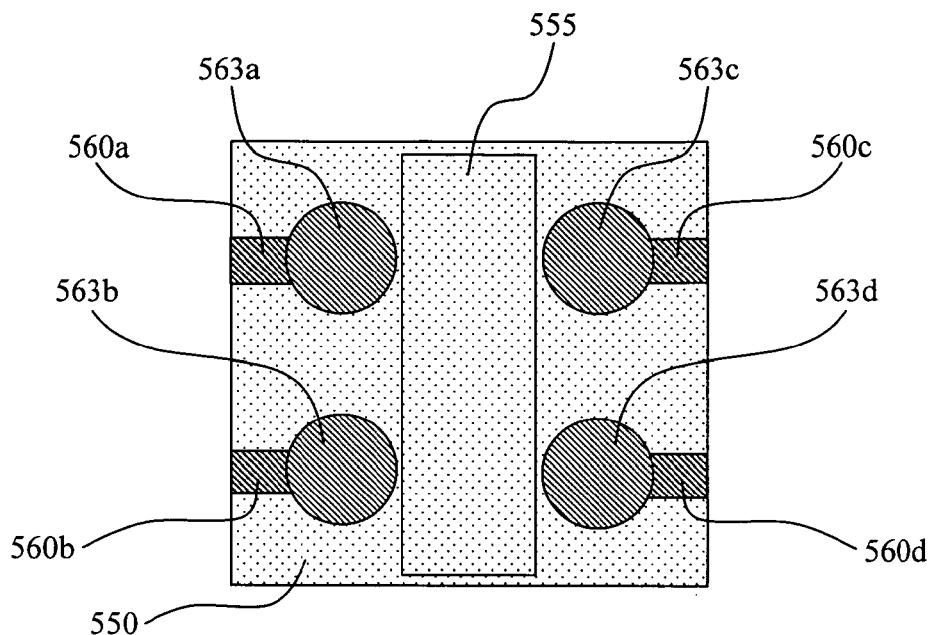
FIG. 5D is a top plan schematic representation of the printed circuit board in accordance with the fifth embodiment of the invention.
Figure 5E:
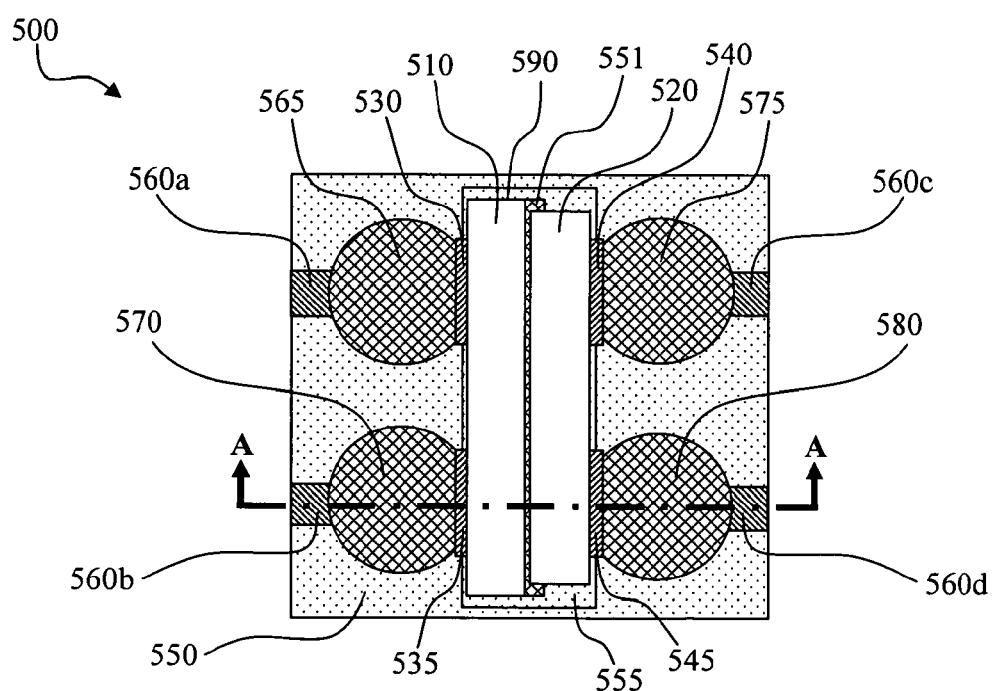
FIG. 5E is a top plan schematic representation of the dual die common drain standing chip scale package coupled to a printed circuit board in accordance with the fifth embodiment of the invention.

In a step 1070, solder balls are dropped on the front sides of the both wafers to provide electrical connection to the gate and source contacts of chips 510 and 520. As shown in FIGS. 5A and 5E, solder balls 565, 570, 575 and 580 are electrically coupled to under metal contacts 530, 535, 540, and 545 respectively. Finally, in a step 1080, the wafers are diced to provide a bumped dual die common drain chip 590.

The bumped dual die common drain chip 590 is electrically coupled to the printed circuit board 550. With reference to FIG. 5D, the printed circuit board 550 has traces 560a, 560b, 560c, and 560d having rounded ends 563a, 563b, 563c, and 563d respectively. Traces 560a and 560b provide electrical connection to the gate contact 530 and the source contact 535 of the first chip 510 respectively, while traces 560c and 560d provide electrical connection to the gate contact 540 and source contact 545 of the second chip 520. Rounded ends 563a, 563b, 563c, and 563d are sized and oriented to underlay the solder balls 565, 570, 575, and 580 respectively, when the bumped dual die common drain chip 590 is positioned within a groove or indentation 555 formed along a portion of the printed circuit board 550.

The groove 555 is sized and configured to closely receive a side portion 511 of the bumped chip 590. The groove 555 provides alignment to the bumped chip 590 such that solder balls 565, 570, 575 and 580 are in overlaying relationship to rounded ends 563a, 563b, 563c and 563d as shown in FIG. 5A and 5E. Additionally, the groove 555 maintains the bumped chip 590 in a standing position wherein the side portion 511 of the bumped chip 590 is disposed within the groove 555 during solder reflow. Advantageously, the printed circuit board 550, being non-conductive, reduces the possibility of a short circuit between the gate and source contacts of the bumped chip 590. Furthermore, in the case where the bumped chips 590 are diced using laser dicing, silicon dioxide may form on the side surfaces of the bumped chips to provide further short circuit protection.

Figure 6:
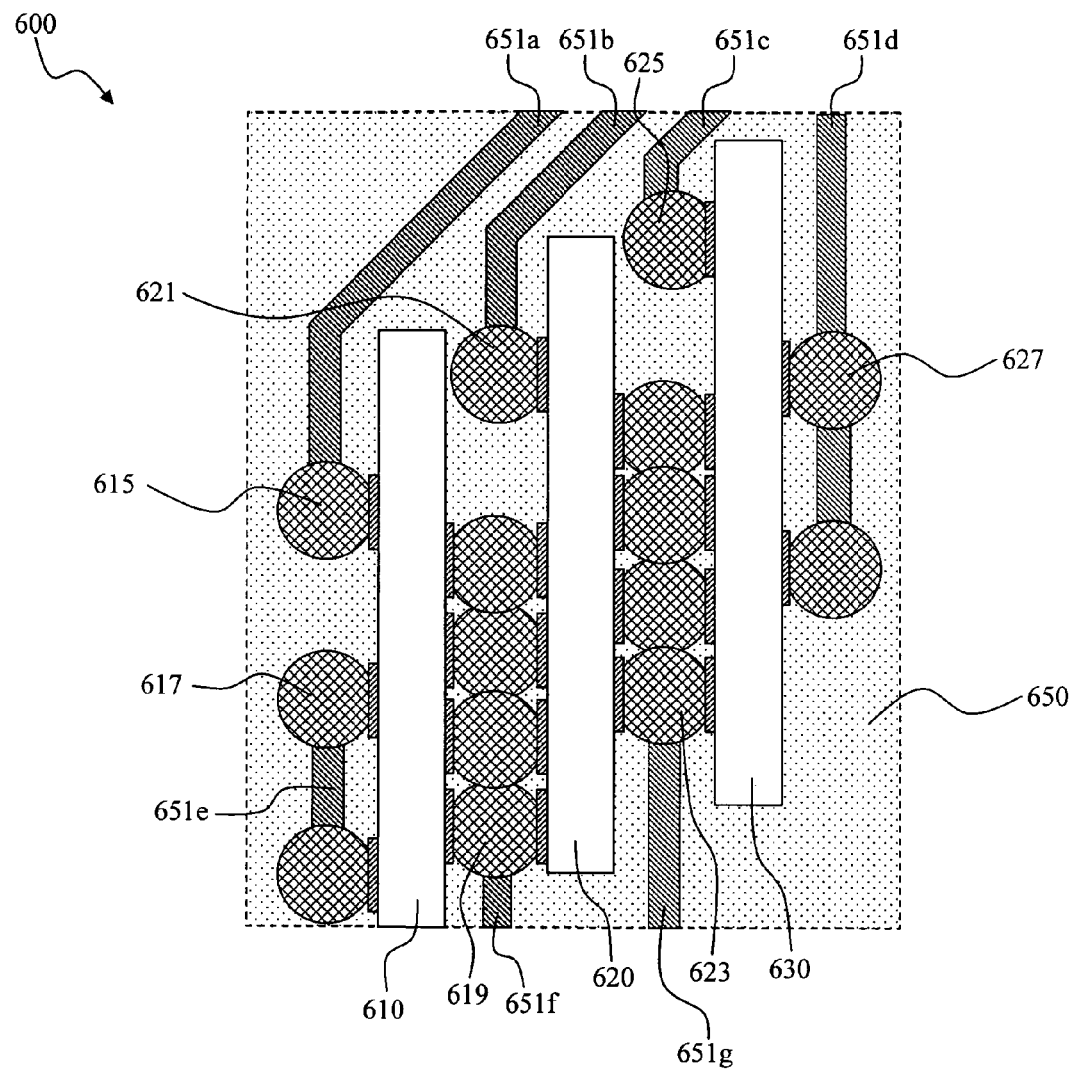
FIG. 6 is a top plan schematic representation of a standing chip scale package showing the package coupled to a printed circuit board in accordance with a sixth embodiment of the invention.

In accordance with a sixth embodiment of the invention, multiple standing chips can be mounted on a PCB. For example in FIG. 6, a standing chip scale package generally designated 600 including a series connection of three MOSFETs is shown electrically coupled to a printed circuit board 650. A first MOSFET 610 includes a gate contact electrically coupled to a trace 651a through solder ball 615. Source contacts of the first MOSFET 610 are electrically coupled to a trace 651e through solder balls 617. Drain contacts of the first MOSFET 610 are electrically coupled to a trace 651f through solder balls 619.

A second MOSFET 620 includes a gate contact electrically coupled to a trace 651b through solder ball 621. Source contacts of the second MOSFET 620 are electrically coupled to the trace 651f and the drain of first MOSFET 610 through solder balls 619. Drain contacts of the second MOSFET 620 are electrically coupled to trace 651g through solder balls 623.

A third MOSFET 630 includes a gate contact electrically coupled to a trace 651c through solder ball 625. Source contacts of the third MOSFET 630 are electrically coupled to the trace 651g and the drain of second MOSFET 620 through solder balls 623. Drain contacts of the third MOSFET 630 are electrically coupled to a trace 651d through solder balls 627.

The gate, source and drain contacts of the first, second, and third MOSFETs 610, 620, and 630 are formed by the fabrication process 900 previously described. The printed circuit board 650 preferably includes grooves sized and configured to closely receive side portions of the MOSFETs 610, 620, and 630 such that the MOSFETs 610, 620, and 630 are disposed on the printed circuit board 650 in a standing configuration. Such a configuration allows for a clear view of solder joints and a reduced printed circuit board mounting area.

Figure 7:
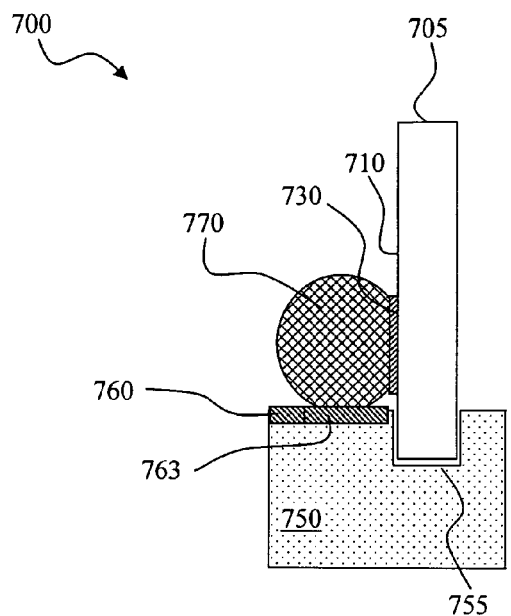
FIG. 7 is a cross-sectional schematic representation of a standing chip scale package showing the package coupled to a printed circuit board in accordance with a seventh embodiment of the invention.

With reference to FIG. 7, a seventh embodiment of the standing chip scale package generally designated 700 includes a chip 705 electrically coupled to a printed circuit board 750. The chip 705 includes a semiconductor device such as a MOSFET.

The chip 705 is shown bumped only on one side 710 thereof to form a bumped chip 710. The bumped chip 710 is closely received within a groove 755 formed in the printed circuit board 750. Contacts 730 of the bumped chip 710 are coupled to printed circuit board traces 760 by means of a solder ball 770 in the manner previously described. Rounded ends 763 of the traces 760 are shaped and positioned to underlay the solder balls 770.

Figure 8A:
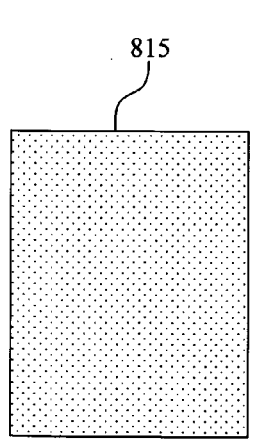
FIGS. 8A-8F graphically illustrate a method of making a surface mount package in accordance with the invention.
Figure 8B:
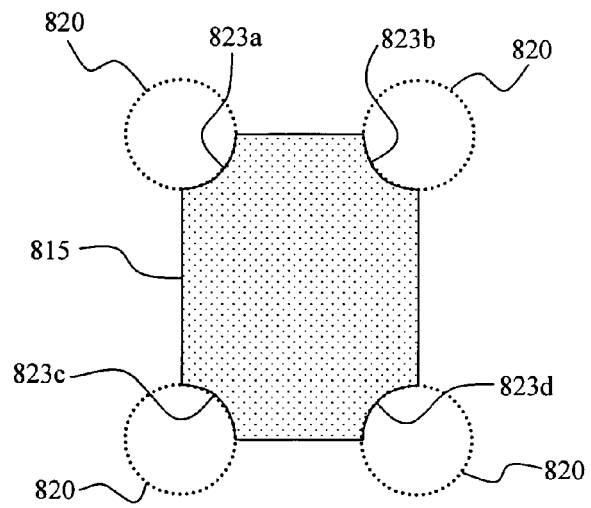
Figure 8C:
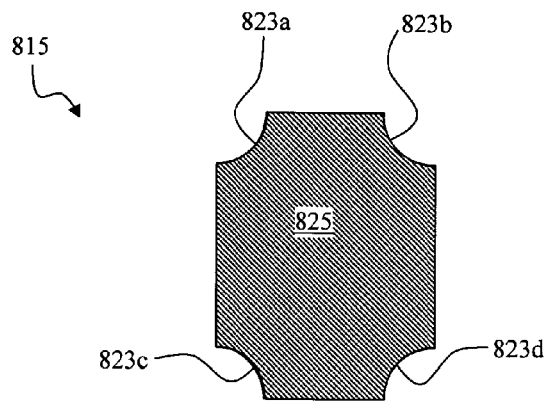

A surface mount package 800 may be formed by a process graphically illustrated in FIGS. 8A-8F. With reference to FIG. 8A, a dummy wafer or substrate is provided having a plurality of die areas 815 (one of which is shown). Through holes 820 are etched at the corners of the plurality of die areas 815 to form curved contact routings 823a, 823b, 823c, and 823d as shown in FIG. 8B. Next, all the surfaces of the dummy wafer are plated with a copper layer 825 as shown in FIG. 8C. At this stage, the dummy wafer has not been diced into individual die areas 815 so the straight sides of the die area 815 are not exposed and thus not plated with the copper layer 825. However, the curved contact routings 823a-823d are exposed and are plated with the copper layer 825. Only the curved contact routings 823a-823d provide electrical connection between the top and the bottom of the die 815.

Figures 1, 8D:
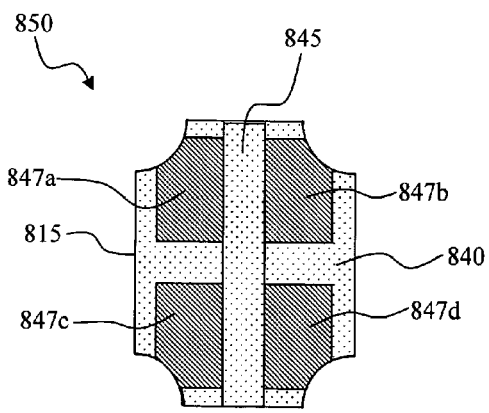
Figures 2, 8D:
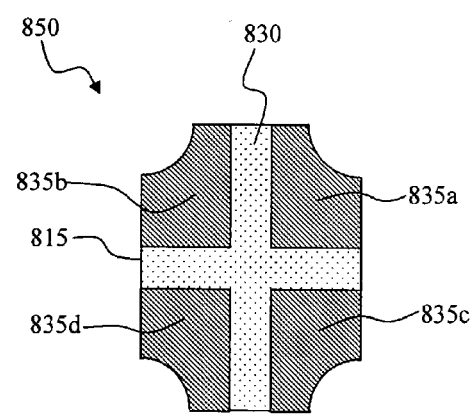
Figure 8E:
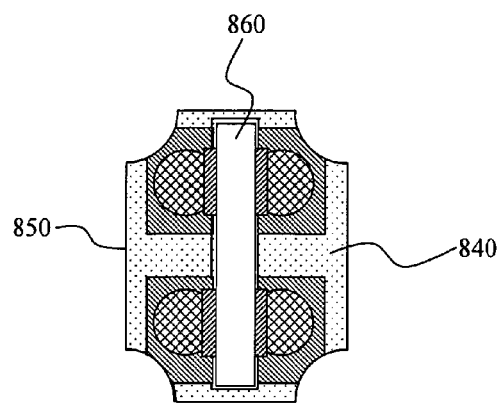

The top and bottom surfaces of the dummy wafer or substrate are then etched, or more conveniently, mechanically half-cut. The copper layer on a bottom surface 830 is divided to provide bottom contacts 835a, 835b, 835c, and 835d as shown in FIG. 8D-2. A top surface 840 (FIG. 8D-1) is divided to provide for top contacts 847a, 847b, 847c, and 847d which are electrically coupled to bottom contacts 835a, 835b, 835c, and 835d respectively through curved contact routes 823a, 823b, 823c, and 823d respectively. The top surface 840 is also grooved to provide a groove 845. This forms a routing die 850. In FIG. 8E, a bumped chip 860 is mounted onto the routing die 850 in the groove 845, in a fashion previously described. The bumped chip 860 is electrically coupled to the contacts 847a, 847b, 847c, and 847d through its solder balls by solder reflow.

Figure 8F:
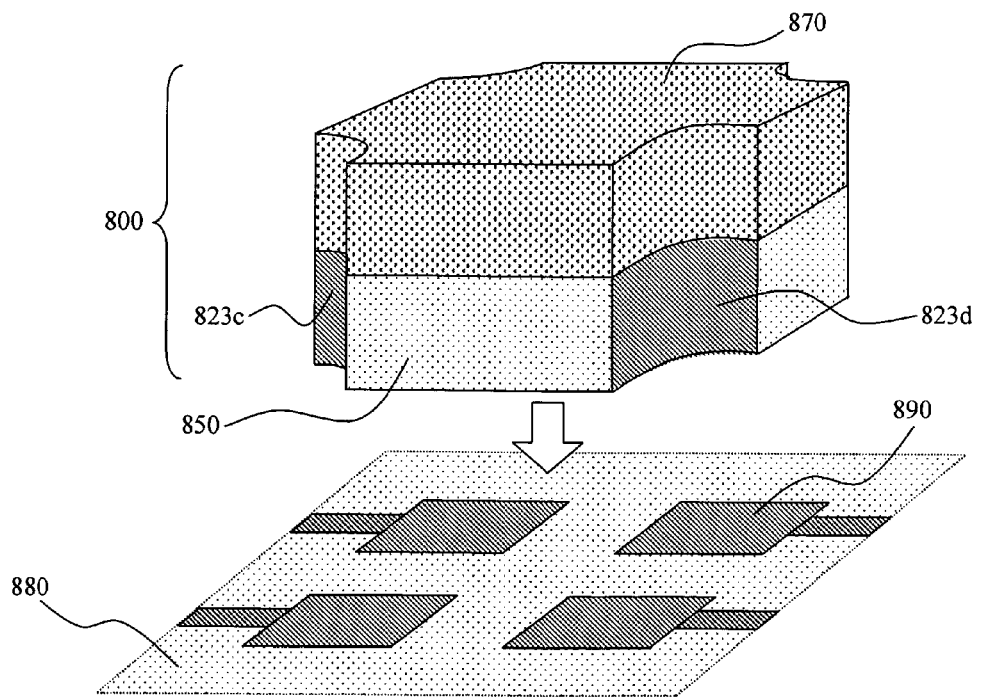

The top of the dummy wafer or substrate comprising the routing dies 850 with mounted bumped chips 860 is then encapsulated with a molding compound 870, with an appropriate mold chase, and diced to form the surface mount package 800 as shown in FIG. 8F. The surface mount package 800 may be surface mounted to a printed circuit board 880 having traces 890.

Figure 11:
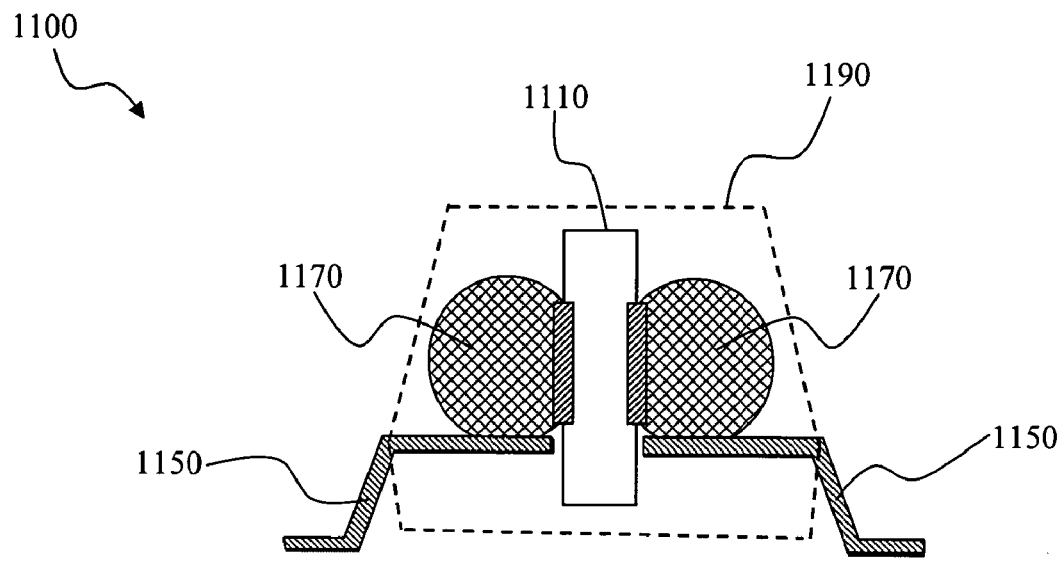
FIG. 11 is a cross-sectional schematic representation of a lead frame package in accordance with the invention.

In yet another embodiment, a lead frame package 1100 incorporating the standing chip scale package of the invention is shown in FIG. 11. A bumped chip 1110 is mounted in the standing position on a lead frame 1150, with solder balls 1170 making electrical connection to the leadframe. The leadframe is encapsulated in a molding compound 1190. This configuration allows for smaller packages, and can eliminate wire bonding and its accompanying wire related inductance and resistance.

In the previous embodiments, the printed circuit board can be replaced with any sort of non-conductive substrate that has the appropriate features for mounting a standing chip scale package of the invention. Such features may include traces for connecting to the solder balls of the standing chip scale package, and a groove to receive the chip.

The standing chip scale package of the invention provides electrical connection to device contacts on both sides of the chip, a clear view of solder joints, and a reduced printed circuit board mounting area.

It is apparent that the above embodiments may be altered in many ways without departing from the scope of the invention. For example, a coating similar to a chip scale packaging underfill material may be coated over the surface of the printed circuit board to provide additional protection against short circuits. Further, various aspects of a particular embodiment may contain patentably subject matter without regard to other aspects of the same embodiment. Still further, various aspects of different embodiments can be combined together. Accordingly, the scope of the invention should be determined by the following claims and their legal equivalents.

What is claimed is:

1. A standing chip scale package comprising: a chip having contacts formed on front and back sides thereof, each contact including a solder ball electrically coupled thereto to form a bumped chip, and wherein the bumped chip is mountable in a standing configuration such that the front and back sides of the bumped chip are substantially perpendicular to a mounting surface, and wherein the contacts comprise an under bump metallization layer.

2. The standing chip scale package of claim 1, wherein the bumped chip is mountable within a groove formed in a printed circuit board for electrical connection between the chip contacts and traces formed on the printed circuit board, the bumped chip being mountable within the groove in the standing configuration.

3. The standing chip scale package of claim 2, wherein the chip is mountable such that the chip contacts are electrically connected to the traces through the solder balls by solder reflow.

4. The standing chip scale package of claim 1, wherein the bumped chip is mountable on a non-conductive substrate for electrical connection between the chip contacts and conductive traces formed on the substrate, the bumped chip being mountable in the standing configuration.

5. The standing chip scale package of claim 4, wherein the chip is mountable such that the solder balls of the chip electrically connect the chip contacts to the conductive traces, the chip contacts and the conductive traces being substantially perpendicular to each other.

6. The standing chip scale package of claim 1, wherein the bumped chip is mountable on a printed circuit board for electrical connection between the chip contacts and conductive traces formed on the printed circuit board, the bumped chip being mountable in the standing configuration.

7. The standing chip scale package of claim 1, wherein the chip is a vertical conduction device.

8. The standing chip scale package of claim 7, wherein the chip is a power MOSFET and a first side of the chip includes a gate contact and at least one source contact and a second side of the chip includes at least one drain contact.

9. The standing chip scale package of claim 1, further comprising a routing die.

10. The standing chip scale package of claim 1, further comprising a leadframe.

11. A standing chip scale package comprising: a chip having contacts formed on a front side thereof, each contact including a solder ball electrically coupled thereto to form a bumped chip, and wherein the bumped chip is mountable in a standing configuration such that the front side and a back side thereof are substantially perpendicular to a mounting surface, wherein the bumped chip further comprises at least one electrical contact thereon and further comprising a conductive post formed on the mounting surface.

12. The standing chip scale package of claim 11, wherein the bumped chip is mountable such that the front side contacts are electrically connected to traces on the mounting surface by solder reflow.

13. The standing chip scale package of claim 11, wherein all the contacts on the bumped chip are on the front side.

14. The standing chip scale package of claim 11, wherein the bumped chip is a MOSFET.

15. The standing chip scale package of claim 11, wherein the first side contacts comprise an under bump metallization layer.

16. A standing chip scale package comprising: a chip having contacts formed on a front side thereof, each contact including a solder ball electrically coupled thereto to form a bumped chip, and wherein the bumped chip is mountable in a standing configuration such that the front side and a back side thereof are substantially perpendicular to a mounting surface, and wherein the first side contacts comprise an under bump metallization layer.

17. The standing chip of claim 16, wherein the bumped chip further comprises a contact.

18. The standing chip of claim 16, further comprising a conductive post formed on the mounting surface.

19. The standing chip scale package of claim 16, wherein the bumped chip is mountable such that the front side contacts are electrically connected to traces on the mounting surface by solder reflow.

20. The standing chip scale package of claim 16, wherein all the contacts on the bumped chip are on the front side.

21. The standing chip scale package of claim 16, wherein the bumped chip is a MOSFET.

* * * * *